United States Patent
Huang et al.

(10) Patent No.: US 8,119,473 B2
(45) Date of Patent: Feb. 21, 2012

(54) HIGH TEMPERATURE ANNEAL FOR ALUMINUM SURFACE PROTECTION

(75) Inventors: Kuo Bin Huang, Jhubei (TW); Ssu-Yi Li, JhuBei Hsinchu (TW); Ryan Chia-Jen Chen, Chiayi (TW); Chi-Ming Yang, Hsian-San District (TW); Chyi Shyuan Chern, Taipei (TW); Chin-Hsiang Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 169 days.

(21) Appl. No.: 12/651,017

(22) Filed: Dec. 31, 2009

(65) Prior Publication Data

US 2011/0156166 A1 Jun. 30, 2011

(51) Int. Cl.
*H01L 21/8232* (2006.01)
(52) U.S. Cl. ........ 438/199; 438/157; 438/195; 438/283; 257/E21.621; 257/E21.623
(58) Field of Classification Search .............. 438/157, 438/195, 199, 283; 257/E21.621, 623
See application file for complete search history.

(56) References Cited

U.S. PATENT DOCUMENTS

| | | | |
|---|---|---|---|
| 2006/0148150 A1* | 7/2006 | Kavalieros et al. | 438/197 |
| 2008/0079084 A1* | 4/2008 | Hanafi | 257/369 |

* cited by examiner

*Primary Examiner* — Minchul Yang
(74) *Attorney, Agent, or Firm* — Haynes and Boone, LLP

(57) ABSTRACT

The present disclosure also provides another embodiment of a method for making metal gate stacks. The method includes forming a first dummy gate and a second dummy gate on a substrate; removing a polysilicon layer from the first dummy gate, resulting in a first gate trench; forming a first metal layer and a first aluminum layer in the first gate trench; applying a chemical mechanical polishing (CMP) process to the substrate; performing an annealing process to the first aluminum layer using a nitrogen and oxygen containing gas, forming an interfacial layer of aluminum, nitrogen and oxygen on the first aluminum layer; thereafter removing the polysilicon layer from the second dummy gate, resulting in a second gate trench; and forming a second metal layer and a second aluminum layer on the second metal layer in the second gate trench.

15 Claims, 6 Drawing Sheets

HIGH TEMPERATURE ANNEAL FOR ALUMINUM SURFACE PROTECTION

BACKGROUND

When a semiconductor device such as a metal-oxide-semiconductor field-effect transistors (MOSFETs) is scaled down through various technology nodes, high k dielectric material and metal are adopted to form a gate stack. However, in a method to form metal gate stacks for n-type MOS (nMOS) transistors and p-type MOS (pMOS) transistors, various issues may arise when integrating the processes and materials for this purpose. For example, when the p-type metal gate of a pMOS transistor is exposed to a polysilicon removal process at a step to form a n-type metal gate, the aluminum and p metal layer filled in the p-type metal gate electrode are damaged, recessed or removed by the etching process to remove the polysilicon from the nMOS transistor region. Furthermore, the n-type metal layer is subsequently deposited in the recessed p-metal gate. This causes high resistance of the p-type metal gate and device performance degradation, such as work function variation of the pMOS metal gate and the threshold voltage shift of the pMOS transistor. Therefore, there is a need for a fabrication method to address the above concerns.

SUMMARY

The present disclosure provides a method for making metal gate stacks of a semiconductor device. The method includes forming a first dummy gate and a second dummy gate on a semiconductor substrate, the first and second dummy gates each including a high k dielectric material layer and a polysilicon layer on the high k dielectric material layer; removing the polysilicon from the first dummy gate, resulting in a first gate trench; forming a first metal gate electrode in the first gate trench, the first metal gate including a metal layer of a first work function and a first aluminum layer on the first metal layer; applying a chemical mechanic polishing (CMP) process to the semiconductor substrate; performing an annealing process to the first aluminum layer in the first metal gate electrode, the annealing process including a nitrogen and oxygen-containing gas and a duration less than about 60 seconds; performing an etch process to remove the polysilicon from the second dummy gate, resulting in a second gate trench; and forming a second metal gate electrode in the second gate trench, the second metal gate electrode including a second metal layer of a second work function different from the first work function and a second aluminum layer on the second metal layer.

The present disclosure also provides another embodiment of a method for making metal gate stacks. The method includes forming a first dummy gate and a second dummy gate on a substrate; removing a polysilicon layer from the first dummy gate, resulting in a first gate trench; forming a first metal layer and a first aluminum layer in the first gate trench; applying a chemical mechanical polishing (CMP) process to the substrate; performing an annealing process to the first aluminum layer using a nitrogen and oxygen containing gas, forming an interfacial layer of aluminum, nitrogen and oxygen on the first aluminum layer; thereafter removing the polysilicon layer from the second dummy gate, resulting in a second gate trench; and forming a second metal layer and a second aluminum layer on the second metal layer in the second gate trench.

The present disclosure also provides one embodiment of a semiconductor structure. The semiconductor structures includes a first type field-effect transistor and a second type field-effect transistor on a substrate. The first type field-effect transistor includes a first gate having a high k dielectric material on the substrate; a first metal layer on the high k dielectric material layer and having a first work function and; a first aluminum layer on the first metal layer; and an interfacial layer on the first aluminum layer, the interfacial layer consisting of aluminum, nitrogen and oxygen. The second type field-effect transistor includes a second gate having the high k dielectric material on the substrate; a second metal layer on the high k dielectric material layer and having a second work function different from the first work function; and a second aluminum layer on the second metal layer.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Various drawings and associated text are provided in a Power Point file. Particularly.

DETAILED DESCRIPTION

Figure 1:
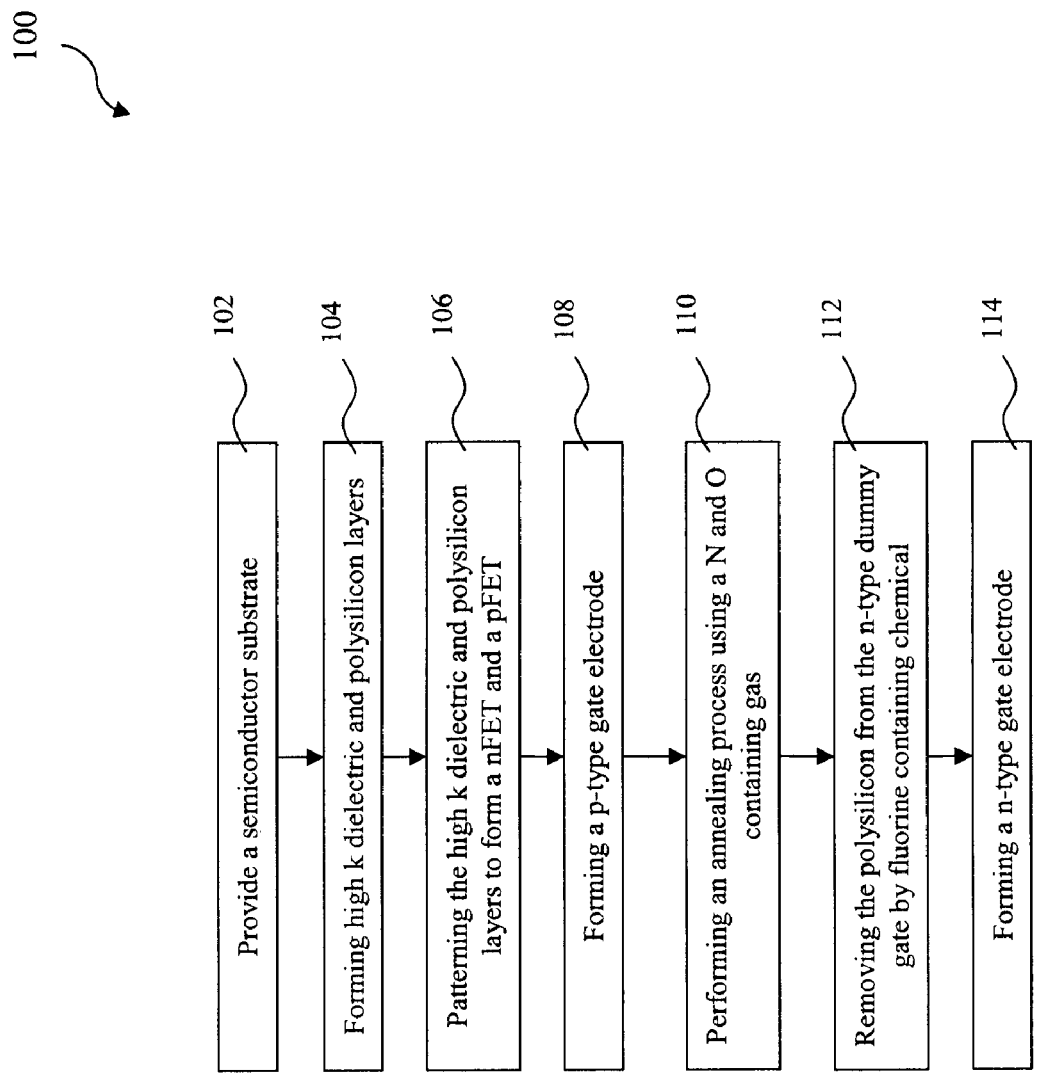
FIG. 1 is a flowchart of a method making a semiconductor device having a metal gate stack in one embodiment constructed according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of one embodiment of a method 100 making a semiconductor device having a metal gate stack constructed according to various aspects of the present disclosure. FIGS. 2 through 6 are sectional views of a semiconductor structure 200 at various fabrication stages constructed according to aspects of the present disclosure in one or more embodiments. The semiconductor structure 200 and the method 100 of making the semiconductor structure are collectively described with reference to FIGS. 1 through 6.

Figure 2:
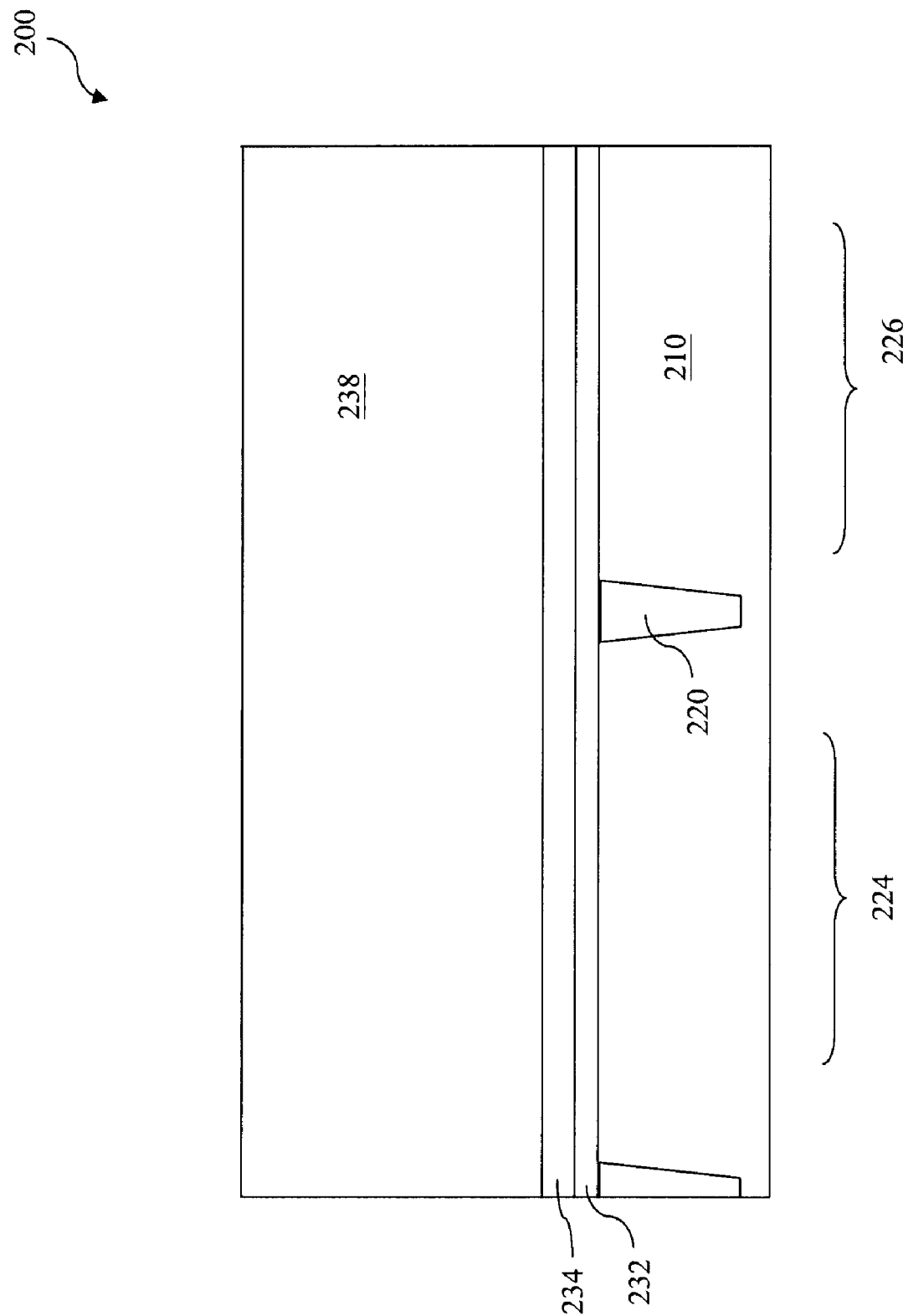
FIGS. 2 through 6 are sectional views of a semiconductor structure having a metal gate stack at various fabrication stages constructed according to various aspects of the present disclosure in various embodiments.

Referring to FIGS. 1 and 2, the method 100 begins at step 102 by providing a semiconductor substrate 210. The semiconductor substrate 210 includes silicon. Alternatively, the substrate includes germanium, silicon germanium or other proper semiconductor materials. The semiconductor substrate also includes various isolation features 220 such as shallow trench isolation formed in the substrate to separate various devices or regions. In one exemplary embodiment, the semiconductor substrate 210 includes a n-type field effect transistor (nFET) region 224 for a nFET to be formed therein, and a p-type FET (pFET) region 226 for a pFET to be formed therein. In one example, the nFET and pFET include metal-oxide-semiconductor (MOS) FETs such as a nMOSFET and a pMOSFET, respectively.

Still referring to FIGS. 1 and 2, the method 100 proceeds to step 104 by forming various gate material layers. In one embodiment, the various gate material layers include a high dielectric constant material (high k dielectric material) layer 234, and a polysilicon layer 238. The high k dielectric material layer 234 is formed by atomic layer deposition (ALD) or other suitable process. Other methods to form the high k dielectric material layer include metal organic chemical vapor deposition (MOCVD), physical vapor deposition (PVD), UV-Ozone Oxidation and molecular beam epitaxy (MBE). In one embodiment, the high k dielectric material includes HfO2. Alternatively, the high k dielectric material layer includes metal nitrides, metal silicates or other metal oxides.

In one embodiment, an interfacial layer (IL) 232 may be additionally formed on the substrate and is interposed between the semiconductor substrate 210 and the high k dielectric material layer 234. The interfacial layer 232 includes a thin silicon oxide layer in one example. The thin silicon oxide is formed on the substrate 210 before forming the high k dielectric material layer 234. The thin silicon oxide layer may be formed by atomic layer deposition (ALD) or thermal oxidation. In another embodiment, a metal layer may be formed on the high k dielectric material layer 234. In one example, the metal layer includes titanium nitride. The high k dielectric material layer in combination with the titanium nitride layer may provide improved device performance, such as low leakage.

Thereafter, the polysilicon layer 238 is formed on the high k dielectric material layer 234. In one example, the polysilicon is formed by a chemical vapor deposition (CVD) or other suitable technique. In one example, silane (SiH4) can be employed as a chemical gas in the CVD process to form the polysilicon layer.

Figure 3:
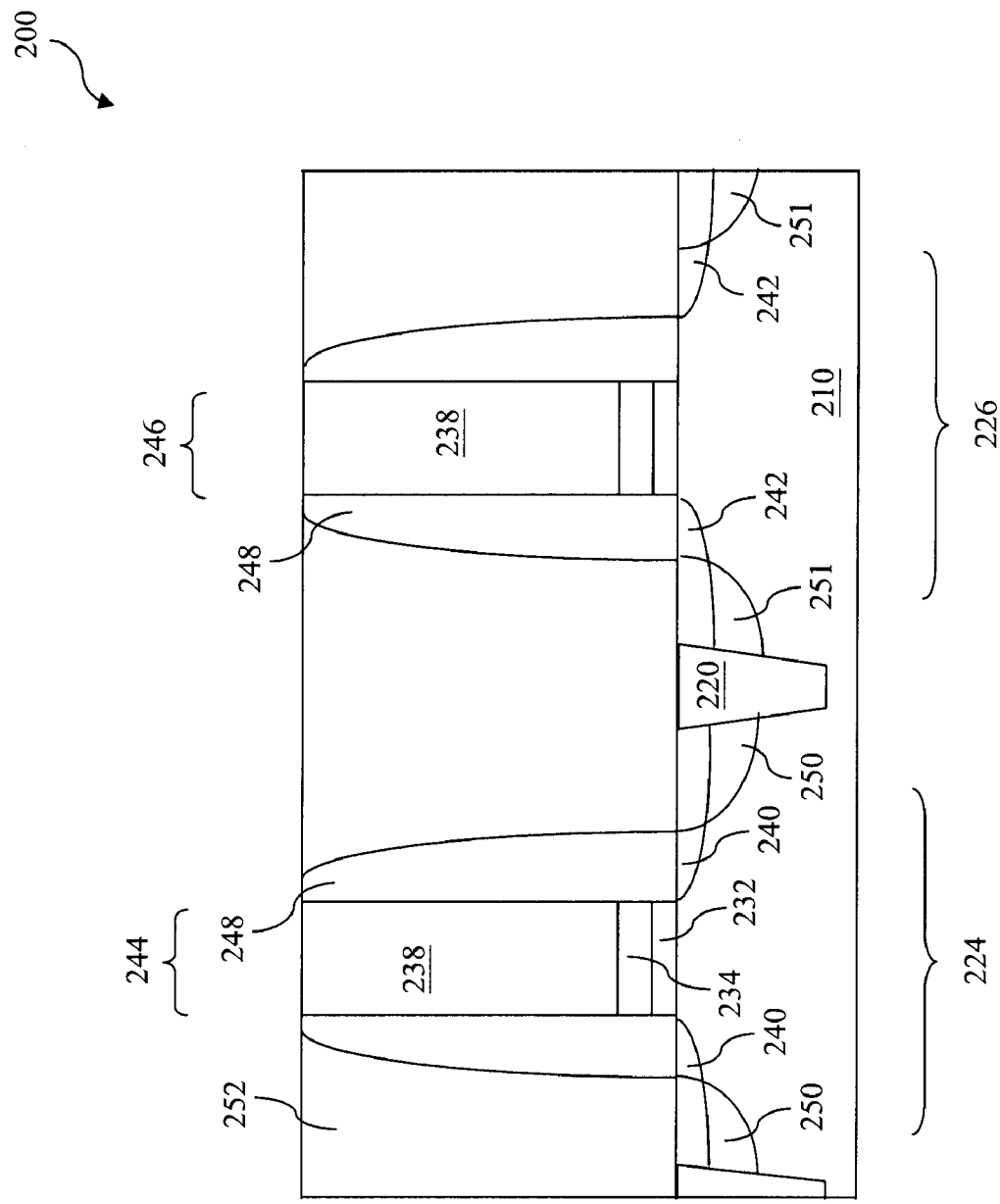

Referring to FIGS. 1 and 3, the method 100 proceeds to step 106 by patterning various material layers to form various nFET dummy gate stacks, and pFET dummy gate stacks. In the present embodiment, the step 106 forms a nFET dummy gate 244 in the nFET region 224, and a pFET dummy gate 246 in the pFET region 226. At step 106, the various material layers are partially removed to form the dummy gates 244, 246 by a process including lithography patterning and etching.

In one embodiment, a patterned photoresist layer is formed on the gate material layers, defining one or more openings of the photoresist layer. The patterned photoresist layer is formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, or ion-beam writing.

Then the various gate material layers are etched away within the openings of the patterned photoresist layer by an etching process. In one embodiment, the etching process utilizes a dry etching process. In one example, the dry etching process implements a fluorine-containing plasma to remove the polysilicon layer. In another example, the dry etching process with the fluorine-containing plasma is implemented to remove the polysilicon layer and the high k dielectric material layer. In furtherance of the example, the etch gas includes CF4. Alternatively, the etching process may include multiple etching steps to etch the various gate material layers. In another embodiment, the etching process includes wet etching chemical, such as fluorine containing chemical.

In another embodiment, a hard mask is formed on the gate material layers. The hard mask layer includes one or more dielectric materials and is formed by a suitable process, such as CVD. In various embodiments, the hard mask layer includes silicon oxide, silicon nitride, silicon oxynitride or a combination thereof in a multi-film structure. A patterned photoresist layer is formed on the hard mask layer. Then the hard mask layer is etched away within the openings of the patterned photoresist layer, resulting in a patterned hard mask layer. The etching process applied to the hard mask layer can be a wet etching process, a dry etching process or a combination thereof. For example, a hydrofluoric (HF) solution may be used to etch a silicon oxide hard mask layer.

LDD features are formed in the nFET region 224 and pFET region 226 by various ion implantation processes such that the LDD regions are aligned with the corresponding dummy gate. In one embodiment, LDD features 240 include n-type dopant and are formed in the nFET region 224. LDD features 242 include p-type dopant and are formed in the pFET region 226. The gate spacers 248 are formed afterward by dielectric deposition and dry etching process. Then heavily doped source and drain (S/D) features are formed by various ion implantation processes and are substantially aligned with the outer edges of the corresponding spacers. In one embodiment, S/D features 250 include n-type dopant and are formed in the nFET region 224. S/D features 251 include p-type dopant and are formed in the pFET region 226. In another embodiment, an etch stop layer (ESL), such as silicon nitride, may be additionally formed on the substrate 210 by CVD or other suitable method.

An inter-level dielectric (ILD) layer 252 is formed on the semiconductor substrate 210 and the dummy gate stacks using a suitable process, such as CVD or spin-on glass (SOG). The ILD includes a dielectric material, such as silicon oxide, low k dielectric material, other suitable dielectric material, or combinations thereof. For example, the ILD layer 252 is formed by a high density plasma CVD. The ILD layer 252 is disposed on the substrate between the dummy gate stacks. The ILD layer 252 is further disposed on the dummy gate stacks.

Then a chemical mechanical polishing (CMP) process is applied to the semiconductor substrate 210 to polish the substrate such that the polysilicon 238 in the dummy gates 244, 246 is exposed. In an alternative embodiment, if a hard mask may be formed on the polysilicon and used to form the dummy gate stacks, the CMP process proceeds until the hard mask is exposed. Then an etching process such as a wet etch dip is applied to remove the hard mask, resulting in an exposed polysilicon 238.

Figure 4:
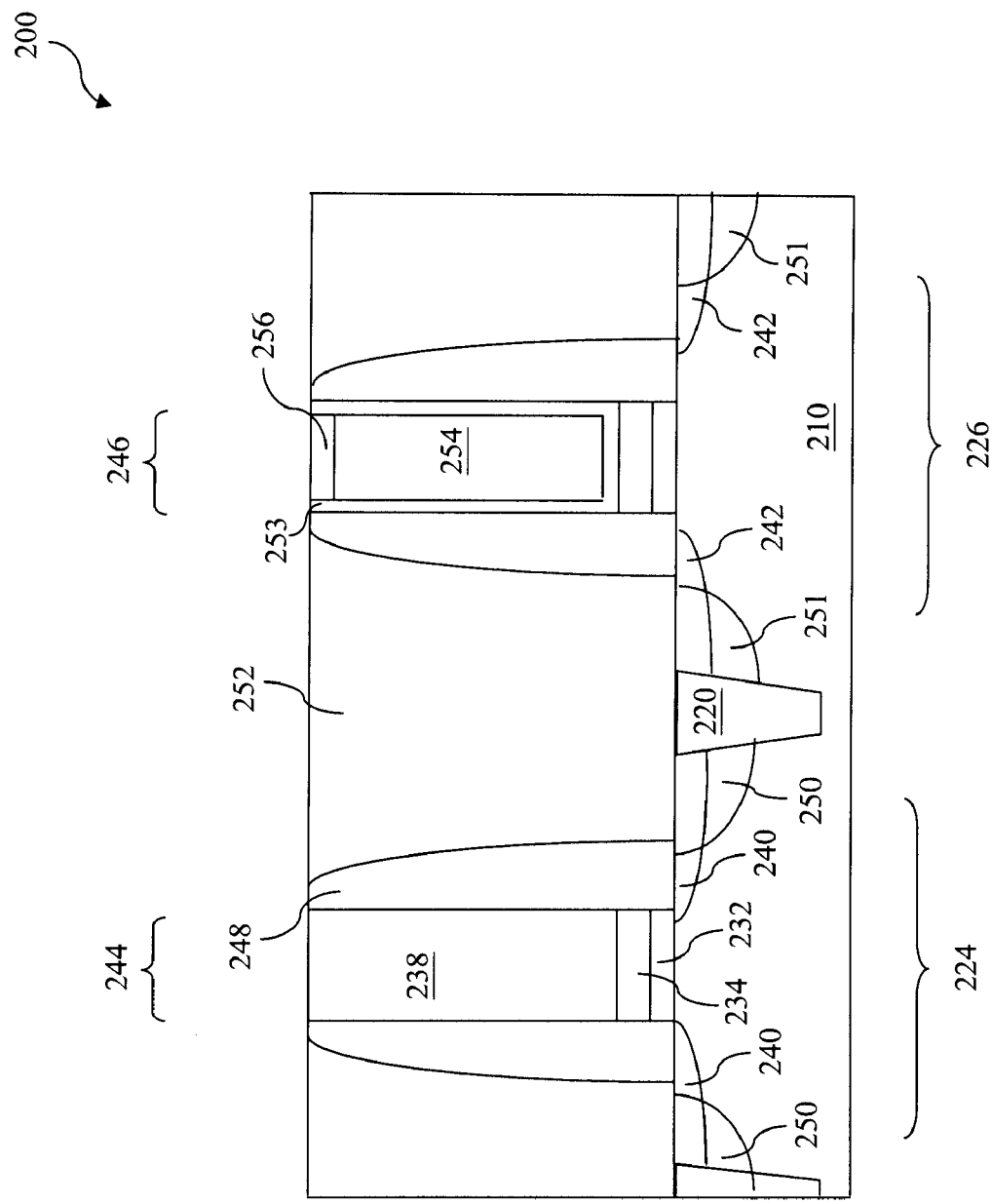

Referring to FIGS. 1 and 4, the method 100 proceeds to step 108 by forming a p-type metal gate electrode 254 in the pFET region 226. The p-type gate electrode 254 includes a metal layer and may have a multi-layer structure with multi metal materials. First, the gate trench is formed by removing the polysilicon in the p-type dummy gate 246 using a process including lithography patterning and etching. In one embodiment, a patterned photoresist layer is formed on the substrate covering the n-type dummy gate 244, and having an opening to expose the p-type dummy gate 246. Then the polysilicon in the p-type dummy gate 246 is removed by an etching process. For example, a potassium hydroxide (KOH) solution may be used to remove the polysilicon in the p-type dummy gate. In another embodiment, the etching process includes multiple etching steps tuned to remove the polysilicon or other material layers intended to be removed, resulting a gate trench in the pFET region 226, also referred to p gate trench. After the removal of the polysilicon layer in the pFET dummy gate, the patterned photoresist layer is stripped by a wet chemical or ashed by oxygen plasma.

The gate trench of the pFET region 226 is filled with one or more metal materials by a suitable technique, such as PVD, CVD or plating. In one example, a metal layer 253 is deposited in the gate trench of the pFET region 226, wherein the metal layer 253 has a proper work function to the pFET. The metal layer 253 is also referred to as p metal or p-type metal. In one embodiment, the p metal has a work function equals or is greater than about 5.2 eV. For example, the p metal includes titanium nitride. In another embodiment, the metal layer 253 includes other suitable conductive material, such as other suitable metal or alloy, to tune the work function for enhanced device performance including improved threshold voltage. An aluminum layer 254 is then filled in the pFET gate trench. In one embodiment, the aluminum layer 253 is formed in the gate trench of the pFET region 226 by a physical vapor deposition (PVD) process. In another embodiment, both the metal layer 253 and the aluminum 254 are formed by PVD in respective chambers of a PVD tool.

A CMP process is thereafter applied to the substrate to remove the excessive materials including the metal layer 253 and the aluminum 254 above the ILD layer, and planarize the substrate surface for subsequent processing steps, resulting in a pFET gate electrode including the metal layer 253 and the aluminum layer 254.

Still referring to FIGS. 1 and 4, the method 100 proceeds to step 110 by performing an annealing process to the aluminum layer 254 using an annealing gas containing both nitrogen and oxygen. In one embodiment, the annealing gas includes N2O. In another embodiment, the annealing gas includes NO. In another embodiment, the annealing gas alternatively includes N2O, NO, N2, or combinations thereof. In one embodiment, the annealing temperature ranges between about 400 degrees C. and about 450 degrees C. In another embodiment, the annealing duration ranges between about 30 seconds and about 60 seconds. In another embodiment, the annealing process includes an annealing pressure at an atmospheric pressure. In another embodiment, the annealing process is implemented in a PVD tool, such as a chamber of the PVD tool to form the aluminum layer. In furtherance of the embodiment, the annealing process is implemented in a PVD chamber with the bias power at about 450 W. The annealing process is applied to the substrate and forms an interfacial layer 256 on the aluminum layer 254 in the pFET region 226. The interfacial layer 256 includes aluminum, nitrogen and oxygen, or referred to as an AlON layer. The interfacial layer is formed by the interaction between the aluminum and N & O containing gas. In one example, the interfacial layer has a thickness of about 100 angstroms.

Figure 5:
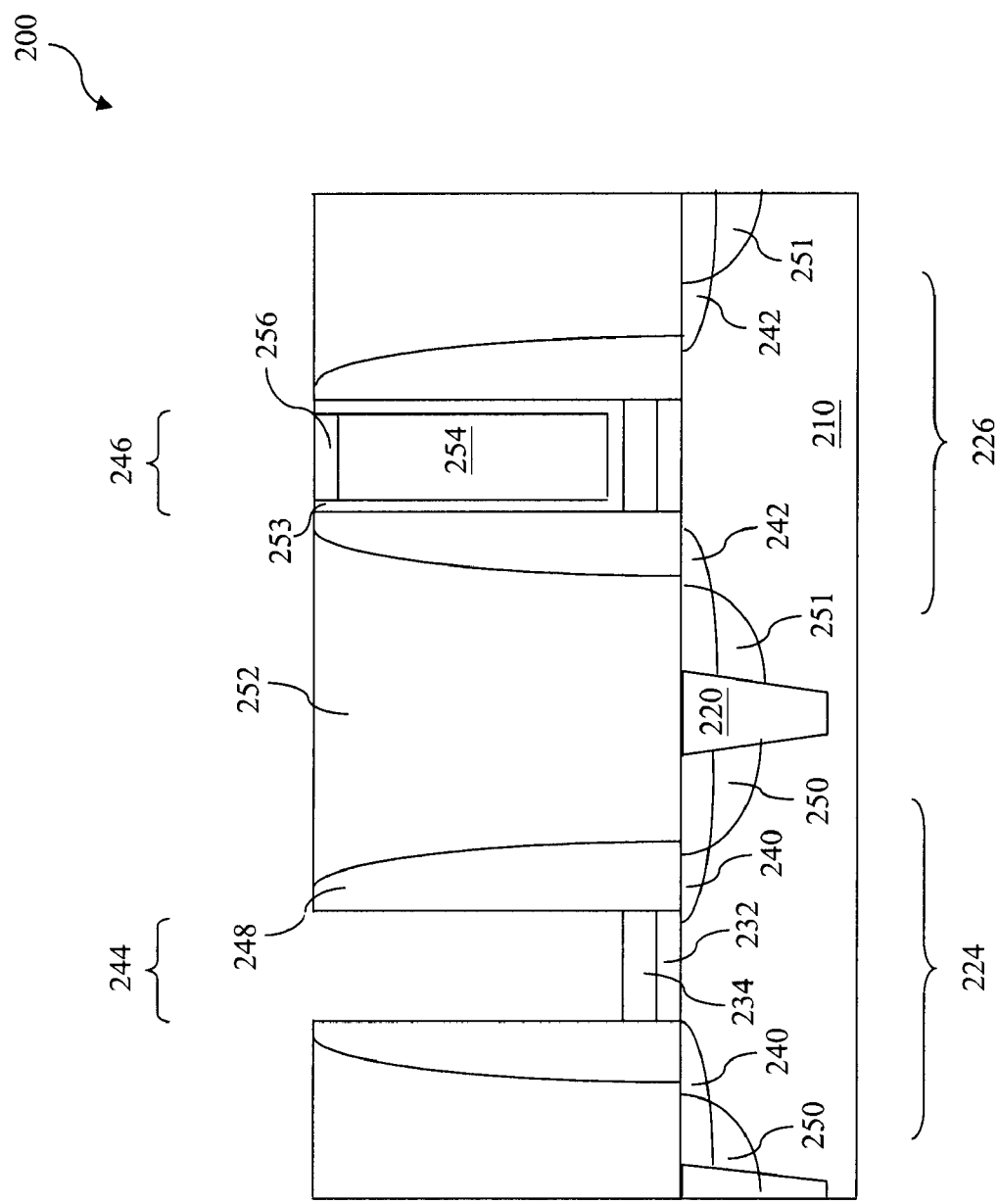

Referring to FIGS. 1 and 5, the method 100 proceeds to next step 112 by applying an etching process to remove the polysilicon layer 238 from the n-type dummy gate 244 in the nFET region 224. In one embodiment, the etching process includes a dry etch using a fluorine-containing gas to remove polysilicon. In another embodiment, after the dry etch, a wet etch is followed to remove polymeric residues introduced during the dry etch. The wet etch uses a fluorine-containing chemical to remove the polymeric residues. In another embodiment, the etching process additionally includes other etching steps tuned to remove the polysilicon or other material layers intended to be removed, forming a gate trench (or n gate trench) in the nFET region 224.

Figure 6:
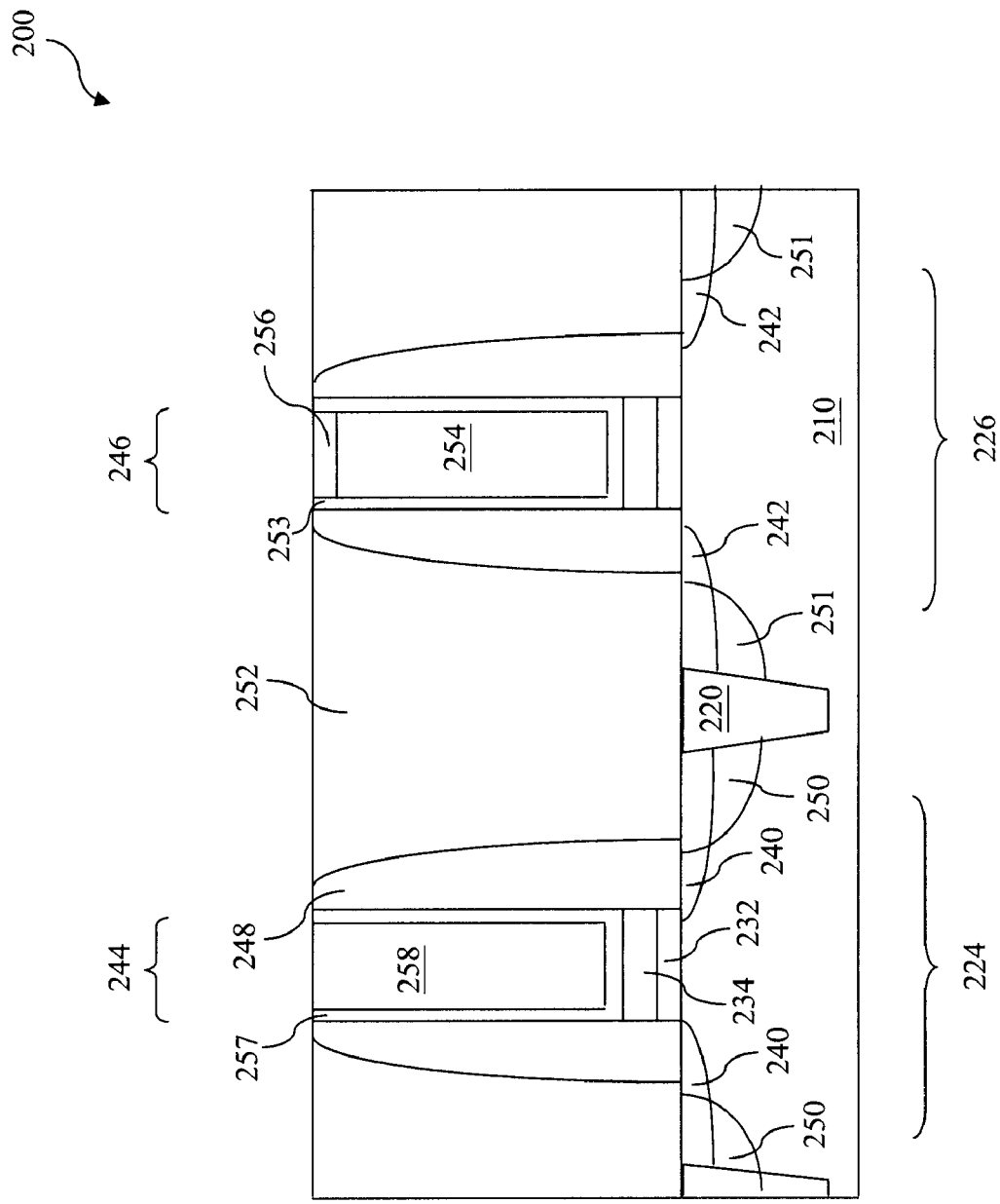

Referring to FIGS. 1 and 6, the method 100 proceeds to step 114 by forming a n-type gate electrode 258 in the nFET region 224. The n-type gate electrode includes a metal layer 257 and may has a multi-layer structure with multi metal materials. In one example, the metal layer 257 has a proper work function to the nFET for enhanced device performance. In one embodiment, the metal layer 257 has a work function equals or is less than about 4.2 eV. For example, the metal layer 257 includes tantalum. The metal layer is also referred to as n metal or n-type metal. An aluminum layer 258 is thereafter filled in the gate trench. In one embodiment, the aluminum filled in the gate trench of the nFET region 224 is formed is formed by a suitable technique, such as PVD. In other embodiments, the aluminum layer 258 may be formed by other suitable technique, such as CVD, plating, or combinations thereof.

Another CMP process is applied to the substrate to remove the excessive portions of the n metal and the aluminum layer, and planarize the substrate surface for subsequent processing steps.

By implementing the disclosed method 100 in various embodiments, some of advantages described below may present. It is understood that different embodiments herein offer different advantages, and that no particular advantage is necessarily required in all embodiments. As one example, after the annealing process to the aluminum layer 254 in the pFET region 226, the interfacial layer 256 is formed on the aluminum layer 254. The interfacial layer 256 functions as a hard mask layer self-aligned to the aluminum layer 254 and protecting the aluminum layer 254 from damage and etch during the subsequent etching process to remove the polysilicon layer 238 of the dummy gate 244 in the nFET region 224. The n meta layer is avoided to be filled in the gate trench of the pFET region. The p metal gate electrode maintains its integrity and its expected work function. Accordingly, the threshold voltage shift of the pFET can be prevented accordingly. In another example, the resistance of the pFET metal gate electrode is not negatively increased, which reduces RC delay of the semiconductor structure and improves the circuit performance. In another example, p metal gate electrode gap filling is improved. Furthermore, considering the CMP process applied to the aluminum 254 can cause defects in the aluminum layer 254, the annealing process can additionally densify the aluminum layer 254 and reduce defects induced by the CMP process.

The present method and the semiconductor structure include various alternatives. In another embodiment, the p metal gate electrode and n metal gate electrode are formed in a different sequence. In this situation, the n metal gate electrode is first formed by removing the polysilicon layer, depositing the n metal layer, filling aluminum, and then applying a CMP process to planarize the substrate and remove the n metal and aluminum above the n metal gate electrode. Then an annealing process is applied to the substrate to form an interfacial layer on the aluminum layer 258 of the nFET region. The interfacial layer covers the n metal gate electrode and expose the pFET dummy gate in the pFET region. The annealing process implemented here and the interfacial layer formed thereby on the aluminum layer 258 in the nFET region 224 is substantially similar to the annealing process and the interfacial layer 256 on the aluminum 254 in the pFET region 226 in terms of formation and composition. For example, the annealing process includes an annealing gas containing both nitrogen and oxygen, such as N2O or NO. Thereafter, the polysilicon layer is removed from the pFET dummy gate in the pFET region. The p metal gate electrode is then formed by a process including depositing the p metal layer, filling aluminum, and then applying a CMP process to planarize the substrate and remove the p metal and aluminum above the p metal gate electrode.

By the disclosed methods and the structures made thereby in various embodiments, the metal gate stacks for nFETs and pFETs are formed with different compositions and configurations. The work functions for nFET and pFET regions are tuned independently. In various embodiments, the performances of the nFETs, pFETs are optimized and enhanced. The issues associated with previous metal gate formation are eliminated or substantially reduced.

In another example, the high k dielectric material layer can be formed by a suitable process such as an atomic layer deposition (ALD). Other methods to form the high k dielectric material layer include metal organic chemical vapor deposition (MOCVD), physical vapor deposition (PVD), and molecular beam epitaxy (MBE). In one embodiment, the high k dielectric material includes HfO2. In another embodiment, the high k dielectric material includes Al2O3. Alternatively, the high k dielectric material layer includes metal nitrides, metal silicates or other metal oxides. The interfacial layer interposed between the semiconductor substrate and the high k dielectric layer can be silicon oxide and may be formed by various suitable methods such as thermal oxidation, ALD or UV-Ozone Oxidation. The interfacial silicon oxide layer may have a thickness less than 10 angstroms. In another example, the silicon oxide layer has a thickness of about 5 angstroms.

The various metal gate layer can be formed by PVD or other suitable process. The disclosed semiconductor structures may include an additional capping layer interposed between the high k dielectric material layer and the metal gate layers. The capping layer includes lanthanum oxide (LaO) in one example. The capping layer may alternatively includes other suitable material. The capping layer may be formed over the high k dielectric layer before the polysilicon layer is disposed. In another embodiment, an titanium nitride layer may be interposed between the high k dielectric material layer and the n metal layer/p metal layer for reduced current leakage.

In another embodiment, the high k dielectric material layer may be formed in the gate last process. Specifically, the high k dielectric material layer is formed in a gate trench (such as n-type gate trench or p-type gate trench) after the removal of the polysilicon layer from the corresponding dummy gate. Then a corresponding metal layer (such as n metal or p metal) is formed on the high k dielectric material layer within the gate trench and an aluminum is filled in the trench. In this case, the high k dielectric layer can be formed in both n metal gate and p meta gate separately.

The various patterning process may include forming a patterned photoresist layer formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint.

In another embodiment, the various patterning process may include forming an additional or alternative patterned hard mask layer. In one example, the patterned hard mask layer includes silicon nitride. As one example of forming the patterned silicon nitride hard mask, a silicon nitride layer is deposited on the polysilicon layer by a low pressure chemical vapor deposition (LPCVD) process. The precursor including dichlorosilane (DCS or SiH2C12), bis(TertiaryButylAmino) silane (BTBAS or C8H22N2Si) and disilane (DS or Si2H6) is used in the CVD process to form the silicon nitride layer. The silicon nitride layer is further patterned using a photolithography process to form a patterned photoresist layer and an etching process to etch the silicon nitride within the openings of the patterned photoresist layer. Other dielectric material may be used as the patterned hard mask. For example, silicon oxynitride may be used as a hard mask.

Although not shown, other processing step may be performed to form various doped regions such as source and drain regions. In one example, a p well is formed in the nFET region by an ion implantation process. In one example, an n well is formed in the pFET region by another ion implantation process. In another embodiment, the gate spacers may have a multilayer structure and may include silicon oxide, silicon nitride, silicon oxynitride, or other dielectric material. The doped source and drain regions and LDD regions of either an n-type dopant or a p-type dopant may be formed by multiple ion implantation steps. N-type dopant impurities employed to form the associated doped regions may include phosphorus, arsenic, and/or other materials. P-type dopant impurities may include boron, indium, and/or other materials.

Other features, such as multilayer interconnection (MLI), may be further formed. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

The isolation features may include different structures and can be formed using different processing technologies. For example, an isolation feature may include shallow trench isolation (STI) features. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

The semiconductor structures in various embodiments and the methods of making the same may be used in other semiconductor devices having a high k and metal gate features, such as strained semiconductor substrate or a hetero-semiconductor device. For example, a strained semiconductor structure may include silicon germanium (SiGe) in the pFET region to enhance the carrier mobility in the channel of the pFET transistor. In another example, the strained semiconductor structure may include silicon carbide (SiC) in the nFET region to enhance the carrier mobility in the channel of the nFET transistor.

The present disclosure is not limited to applications in which the semiconductor structure includes a MOS transistor, and may be extended to other integrated circuit having a metal gate stack. For example, the semiconductor structures may include a dynamic random access memory (DRAM) cell, a single electron transistor (SET), and/or other microelectronic devices (collectively referred to herein as microelectronic devices). In another embodiment, the semiconductor structure includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

In another embodiment, the semiconductor substrate may include an epitaxial layer. For example, the substrate may have an epitaxial layer overlying a bulk semiconductor. Further, the substrate may be strained for performance enhancement. For example, the epitaxial layer may include a semiconductor material different from those of the bulk semiconductor such as a layer of silicon germanium overlying a bulk silicon, or a layer of silicon overlying a bulk silicon germanium formed by a process including SEG. Furthermore, the substrate may include a semiconductor-on-insulator (SOI) structure such as a buried dielectric layer. Alternatively, the substrate may include a buried dielectric layer such as a buried oxide (BOX) layer, such as that formed by a method referred to as separation by implantation of oxygen (SIMOX) technology, wafer bonding, selective epitaxial growth (SEG), or other proper method.

Thus, the present disclosure provides a method for making metal gate stacks of a semiconductor device. The method includes forming a first dummy gate and a second dummy gate on a semiconductor substrate, the first and second dummy gates each including a high k dielectric material layer and a polysilicon layer on the high k dielectric material layer; removing the polysilicon from the first dummy gate, resulting in a first gate trench; forming a first metal gate electrode in the first gate trench, the first metal gate including a metal layer of a first work function and a first aluminum layer on the first metal layer; applying a chemical mechanic polishing (CMP) process to the semiconductor substrate; performing an annealing process to the first aluminum layer in the first metal gate electrode, the annealing process including a nitrogen and oxygen-containing gas and a duration less than about 60 seconds; performing an etch process to remove the polysilicon from the second dummy gate, resulting in a second gate trench; and forming a second metal gate electrode in the second gate trench, the second metal gate electrode including a second metal layer of a second work function different from the first work function and a second aluminum layer on the second metal layer.

The present disclosure also provides another embodiment of a method for making metal gate stacks. The method includes forming a first dummy gate and a second dummy gate on a substrate; removing a polysilicon layer from the first dummy gate, resulting in a first gate trench; forming a first metal layer and a first aluminum layer in the first gate trench; applying a chemical mechanical polishing (CMP) process to the substrate; performing an annealing process to the first aluminum layer using a nitrogen and oxygen containing gas, forming an interfacial layer of aluminum, nitrogen and oxygen on the first aluminum layer; thereafter removing the polysilicon layer from the second dummy gate, resulting in a second gate trench; and forming a second metal layer and a second aluminum layer on the second metal layer in the second gate trench.

The present disclosure also provides one embodiment of a semiconductor structure. The semiconductor structures includes a first type field-effect transistor and a second type field-effect transistor on a substrate. The first type field-effect transistor includes a first gate having a high k dielectric material on the substrate; a first metal layer on the high k dielectric material layer and having a first work function and; a first aluminum layer on the first metal layer; and an interfacial layer on the first aluminum layer, the interfacial layer consisting of aluminum, nitrogen and oxygen. The second type field-effect transistor includes a second gate having the high k dielectric material on the substrate; a second metal layer on the high k dielectric material layer and having a second work function different from the first work function; and a second aluminum layer on the second metal layer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for making metal gate stacks of a semiconductor device, comprising:
    forming a first dummy gate and a second dummy gate on a semiconductor substrate, the first and second dummy gates each including a dielectric material layer and a polysilicon layer on the dielectric material layer;
    removing the polysilicon from the first dummy gate, resulting in a first gate trench;
    forming a first metal gate electrode in the first gate trench, the first metal gate including a metal layer of a first work function and a first aluminum layer on the first metal layer;
    applying a chemical mechanic polishing (CMP) process to the semiconductor substrate;
    performing an annealing process to the first aluminum layer in the first metal gate electrode, the annealing process including a nitrogen and oxygen-containing gas and a duration less than about 60 seconds;
    performing an etch process to remove the polysilicon from the second dummy gate, resulting in a second gate trench; and
    forming a second metal gate electrode in the second gate trench, the second metal gate electrode including a second metal layer of a second work function different from the first work function and a second aluminum layer on the second metal layer.

2. The method of claim 1, wherein the performing the annealing process includes applying a N2O gas.

3. The method of claim 1, wherein the performing the annealing process includes applying a NO gas.

4. The method of claim 1, wherein the performing the annealing process includes an annealing temperature ranging between about 400° C. and about 450° C.

5. The method of claim 1, wherein the performing the annealing process includes performing the annealing process in an atmospheric pressure and the duration greater than about 30 seconds.

6. The method of claim 1, wherein the performing the annealing process to the first aluminum layer forms an interfacial layer with an etch resistance to the etch process.

7. The method of claim 6, wherein the interfacial layer includes aluminum, nitrogen and oxygen.

8. The method of claim 1, wherein the etch process includes a dry etch employing a fluorine containing gas and a wet etch employing a fluorine containing chemical.

9. The method of claim 1, wherein the first work function equals or is greater than about 5.2 eV and the second work function equals or is less than about 4.2 eV.

10. The method of claim 1, wherein the forming the first dummy gate and second dummy gate includes:
   forming a high k dielectric material layer on the semiconductor substrate;
   forming the polysilicon layer on the high k dielectric layer; and
   patterning the high k dielectric material layer and the polysilicon layer to form the first and second dummy gates.

11. A method, comprising:
   forming a first dummy gate and a second dummy gate on a substrate;
   removing a polysilicon layer from the first dummy gate, resulting in a first gate trench;
   forming a first metal layer and a first aluminum layer in the first gate trench;
   applying a chemical mechanical polishing (CMP) process to the substrate;
   performing an annealing process to the first aluminum layer using a nitrogen and oxygen containing gas thereby forming an interfacial layer of aluminum, nitrogen and oxygen on the first aluminum layer;
   thereafter removing a polyslicon layer from the second dummy gate, resulting in a second gate trench; and
   forming a second metal layer and a second aluminum layer on the second metal layer in the second gate trench.

12. The method of claim 11, wherein the first metal layer has a work function different from that of the second metal layer.

13. The method of claim 11, wherein the performing the annealing process includes using an annealing gas selected from the group consisting of N2O, NO, and a combination thereof.

14. The method of claim 11, wherein the performing the annealing process includes an annealing duration ranging between about 30 seconds and about 60 seconds, an annealing temperature ranging between about 400° C. and about 450° C., and an atmospheric annealing pressure.

15. The method of claim 11, wherein the forming of the first metal layer and the first aluminum layer includes forming the first metal layer and the first aluminum layer in a physical vapor deposition (PVD) tool and the performing of the annealing process includes performing the annealing process in a PVD chamber of the PVD tool.

* * * * *